United States Patent
Kato

(10) Patent No.: US 10,128,465 B2
(45) Date of Patent: Nov. 13, 2018

(54) DISPLAY DEVICE INCLUDING SEALING STRUCTURE WHICH SUPPRESSES WATER PENETRATION INTO DISPLAY REGION

(71) Applicant: Japan Display Inc., Minato-ku (JP)

(72) Inventor: Daisuke Kato, Minato-ku (JP)

(73) Assignee: Japan Display Inc., Minato-ku (JP)

(*) Notice: Subject to any disclaimer, the term of this patent is extended or adjusted under 35 U.S.C. 154(b) by 0 days.

(21) Appl. No.: 15/363,734

(22) Filed: Nov. 29, 2016

(65) Prior Publication Data

US 2017/0187000 A1      Jun. 29, 2017

(30) Foreign Application Priority Data

Dec. 29, 2015   (JP) .................... 2015-257676

(51) Int. Cl.
| | |
|---|---|
| *H01L 29/22* | (2006.01) |
| *H01L 51/52* | (2006.01) |
| *H01L 33/48* | (2010.01) |
| *H01L 27/32* | (2006.01) |
| *H01L 51/56* | (2006.01) |

(52) U.S. Cl.
CPC ........ *H01L 51/5259* (2013.01); *H01L 27/322* (2013.01); *H01L 27/3272* (2013.01); *H01L 27/3276* (2013.01); *H01L 33/483* (2013.01); *H01L 51/525* (2013.01); *H01L 51/5243* (2013.01); *H01L 51/5246* (2013.01); *H01L 51/56* (2013.01); *H01L 27/3244* (2013.01); *H01L 51/5237* (2013.01)

(58) Field of Classification Search
CPC . H01L 33/483; H01L 33/52; H01L 518/5237; H01L 51/24; H01L 51/5246; H01L 51/5259

USPC .................................... 257/99; 349/58, 153
See application file for complete search history.

(56) References Cited

U.S. PATENT DOCUMENTS

| | | | |
|---|---|---|---|
| 7,619,258 B2* | 11/2009 | Tsuchiya ............ | H01L 27/3246 257/40 |
| 2001/0030730 A1* | 10/2001 | Iwanaga ............... | G02F 1/1339 349/153 |
| 2003/0168966 A1 | 9/2003 | Kobayashi et al. | |

(Continued)

FOREIGN PATENT DOCUMENTS

| | | |
|---|---|---|
| JP | 2002-8852 | 1/2002 |
| JP | 2006-80094 | 3/2006 |

(Continued)

OTHER PUBLICATIONS

Korean Office Action dated Feb. 26, 2018 in Korean Patent Application No. 10-2016-0159346 (with English translation), 13 pages.

*Primary Examiner* — Matthew E Warren
(74) *Attorney, Agent, or Firm* — Oblon, McClelland, Maier & Neustadt, L.L.P.

(57) ABSTRACT

A display device, which includes a display region constituted by a plurality of pixels, includes a first substrate having a hygroscopic agent formed in a peripheral region outside the display region and a sealing film covering the hygroscopic agent, a second substrate disposed facing the first substrate, and an adhesive layer, at least a portion of which is disposed closer to the side of the display region than the hygroscopic agent, and which bonds the first substrate to the second substrate.

15 Claims, 7 Drawing Sheets

(56) References Cited

U.S. PATENT DOCUMENTS

| | | | |
|---|---|---|---|
| 2004/0185301 A1* | 9/2004 | Tsuchiya | H01L 51/5253 428/690 |
| 2005/0112408 A1 | 5/2005 | Kobayashi et al. | |
| 2007/0228380 A1* | 10/2007 | Yoshinaga | H01L 51/5092 257/72 |
| 2012/0314148 A1* | 12/2012 | Yamaguchi | H01L 51/5246 349/42 |

FOREIGN PATENT DOCUMENTS

| | | |
|---|---|---|
| JP | 2007-73459 A | 3/2007 |
| JP | 2008-77951 | 4/2008 |
| JP | 2010-198926 | 9/2010 |
| JP | 2013-110116 | 6/2013 |
| KR | 10-2012-0136433 A | 12/2012 |
| KR | 10-2015-0011235 A | 1/2015 |

* cited by examiner

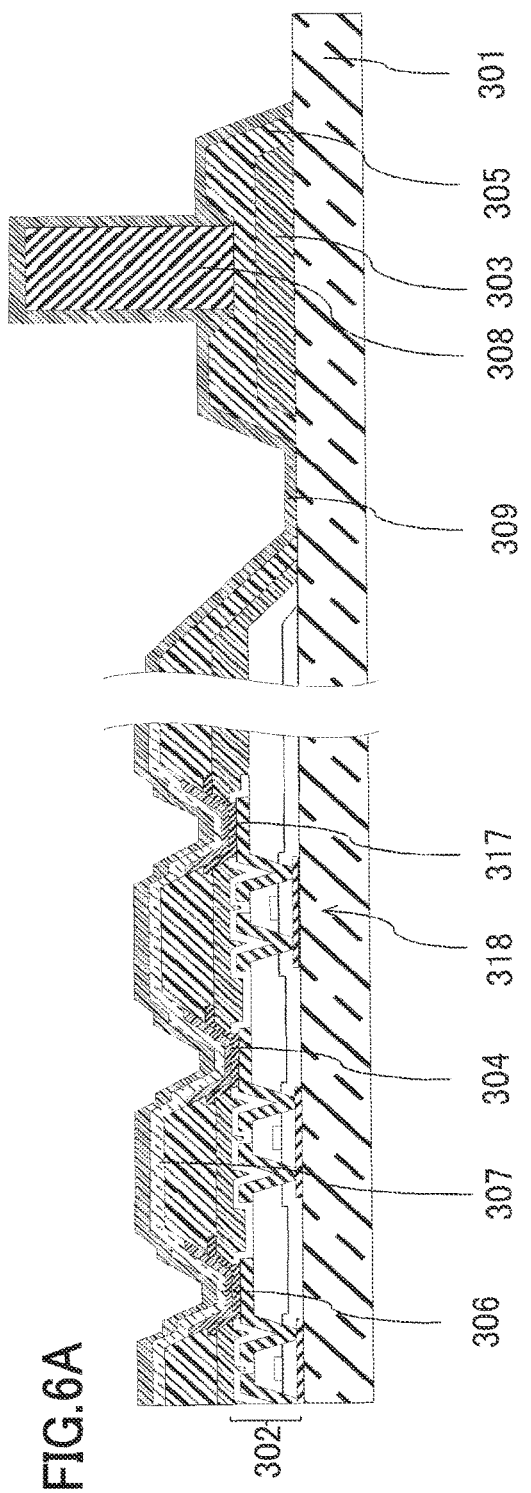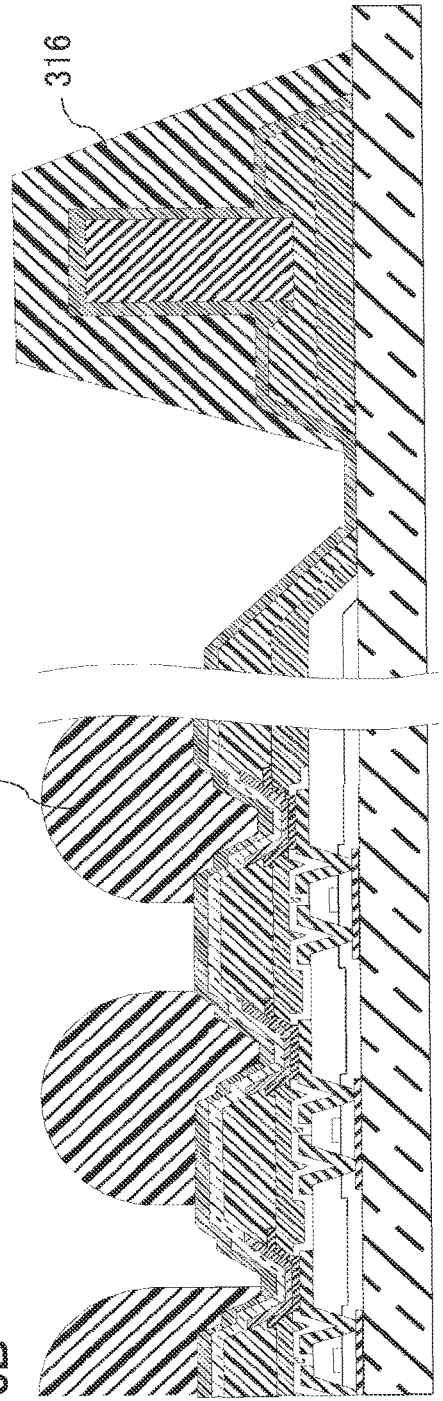

DISPLAY DEVICE INCLUDING SEALING STRUCTURE WHICH SUPPRESSES WATER PENETRATION INTO DISPLAY REGION

CROSS-REFERENCE TO RELATED APPLICATION

The present application claims priority from the Japanese Application JP2015-257676 filed on Dec. 29, 2015, the content of which is hereby incorporated by reference into this application.

BACKGROUND OF THE INVENTION

1. Field of the Invention

The present invention relates to a display device and a method of manufacturing a display device.

2. Description of the Related Art

Recently, display devices such as liquid crystal display devices and organic EL display devices using an organic EL (electro-luminescent) element have been put to practical use. However, an organic EL element is vulnerable to a water molecule, an oxygen molecule, etc., and therefore, there is a fear that an organic EL element is deteriorated to cause lighting failure such as a dark spot. Further, also in a liquid crystal display device, the properties of a thin film transistor vary due to the effect of penetrating water, and a problem arises that the display quality is deteriorated.

Therefore, for example, JP 2006-80094 A discloses a display device in which a calcium member having hygroscopicity is formed in a peripheral portion in a substrate plane on a glass substrate, and the calcium member is covered with an adhesive which bonds the glass substrate to a protective glass, whereby a water molecule is prevented from penetrating into a display region.

Further, for example, JP 2010-198926 A discloses a display device in which a polar material is provided between an element substrate on which a light-emitting element is to be formed and a sealing substrate to be bonded to the element substrate, and the polar material adsorbs a bubble contained in a sealing agent which bonds the two substrates, whereby the occurrence of a chemical reaction between the light-emitting element and an oxygen molecule or a water molecule contained in the bubble is prevented.

Further, JP 2002-8852 A discloses an organic EL display device which includes a sealing member formed so as to seal an organic EL layer, and in which a deoxygenation and dehydration section is formed at any position in a space sealed by the sealing member.

Further, JP 2013-110116 A discloses a display device in which a sealing substrate covering an electrode layer with an adhesive in an outer peripheral portion of a substrate is included, whereby water or the like is prevented from penetrating from the outside of the sealing substrate.

Further, JP 2008-77951 A discloses a display device in which a sealing material is applied to an outer periphery of a liquid-repellent frame body, and a layer containing a hygroscopic substance is made to face an organic EL element of a flat element substrate and bonded thereto, and then sealed by curing the sealing material, whereby water or the like is prevented from penetrating inside the frame body.

SUMMARY OF THE INVENTION

Even if the outer periphery of a substrate having an organic EL element formed thereon is sealed with an organic material such as a sealing material as in the above-mentioned related art references, water gradually penetrates into a display region through the sealing material or the like. Further, even in the case where a configuration in which a hygroscopic agent or the like is formed on a substrate is adopted, in the process until a display panel is completed after a step of forming a hygroscopic agent, the hygroscopic agent reacts with water or the like, and therefore, the performance of the hygroscopic agent is deteriorated at the time when the display panel is completed.

The invention has been made in view of the above-mentioned problems, and an object of the invention is to provide an image display device capable of preventing the deterioration of a light-emitting element by effectively suppressing the penetration of a water molecule into the light-emitting element.

According to one aspect of the present invention, a display device, which includes a display region constituted by a plurality of pixels, includes a first substrate having a hygroscopic agent formed in a peripheral region outside the display region and a sealing film covering the hygroscopic agent, a second substrate disposed facing the first substrate, and an adhesive layer, at least a portion of which is disposed closer to the side of the display region than the hygroscopic agent, and which bonds the first substrate to the second substrate.

In one embodiment of the present invention, the sealing film has a pore which exposes the hygroscopic agent.

In one embodiment of the present invention, the pore is a penetration pore which allows the penetration of a water molecule.

In one embodiment of the present invention, the hygroscopic agent has an upper face facing the second substrate. A portion of the sealing film is located between the upper face and the second substrate. The portion is provided with a pore which is recessed toward the upper face.

In one embodiment of the present invention, the pore exposes the upper face.

In one embodiment of the present invention, the hygroscopic agent is formed as a support pillar which keeps an interval between the first substrate and the second substrate.

In one embodiment of the present invention, the hygroscopic agent is formed from an alkali metal or an alkaline earth metal.

In one embodiment of the present invention, the hygroscopic agent is formed so as to surround the four sides of the peripheral region with at least two discontinuous regions.

In one embodiment of the present invention, each of the plurality of pixels includes a light-emitting element including an anode electrode, a light-emitting layer, and a cathode electrode, and the sealing film covers the light-emitting element.

In one embodiment of the present invention, at least a portion of the adhesive layer is located in the display region, and the sealing film is covered with the adhesive layer in the display region.

In one embodiment of the present invention, the adhesive layer is located in the peripheral region so as to surround the display region and also cover the hygroscopic agent.

According to another aspect of the present invention, a display device, includes a display region including a plurality of pixels, and a peripheral region outside the display region. Each of the plurality of pixels includes a light-emitting element including an anode electrode, a light-emitting layer, and a cathode electrode. The light-emitting element is provided on a first substrate. In the first substrate, a sealing film which is located astride the display region and the peripheral region, and covers the light-emitting element is provided. In the peripheral region, a hygroscopic agent which is located between the first substrate and the sealing film is provided. In the peripheral region, a dam agent which surrounds the display region is provided. A portion of the sealing film and the hygroscopic agent are covered with the dam agent.

In one embodiment of the present invention, the sealing film has a pore which exposes the hygroscopic agent.

In one embodiment of the present invention, the hygroscopic agent has an upper face located on the opposite side to the first substrate of the hygroscopic agent. A portion of the sealing film faces the upper face, and the portion is provided with a pore which is recessed toward the upper face.

In one embodiment of the present invention, the hygroscopic agent contains an alkali metal or an alkaline earth metal.

In one embodiment of the present invention, the hygroscopic agent is formed into a pillar shape. The sealing film has a surface located on the opposite side to the first substrate of the sealing film. A distance from the first substrate to the upper face of the hygroscopic agent formed into a pillar shape is larger than a distance from the first substrate to the surface in the display region.

According to another aspect of the present invention, there is provided a method of manufacturing a display device including a display region constituted by a plurality of pixels. The method includes a step of forming a first substrate having a hygroscopic agent formed in a peripheral region outside the display region and a sealing film formed so as to cover the hygroscopic agent, a step of forming a second substrate facing the first substrate, a step of dropping an adhesive composed of an organic material onto one of the first substrate and the second substrate, and a step of forming a crack in the sealing film by pressing when bonding the first substrate to the second substrate with the adhesive.

BRIEF DESCRIPTION OF THE DRAWINGS

FIGS. 6A and 6B are views for illustrating a step of manufacturing the organic EL panel.

DETAILED DESCRIPTION OF THE INVENTION

Figure 1:
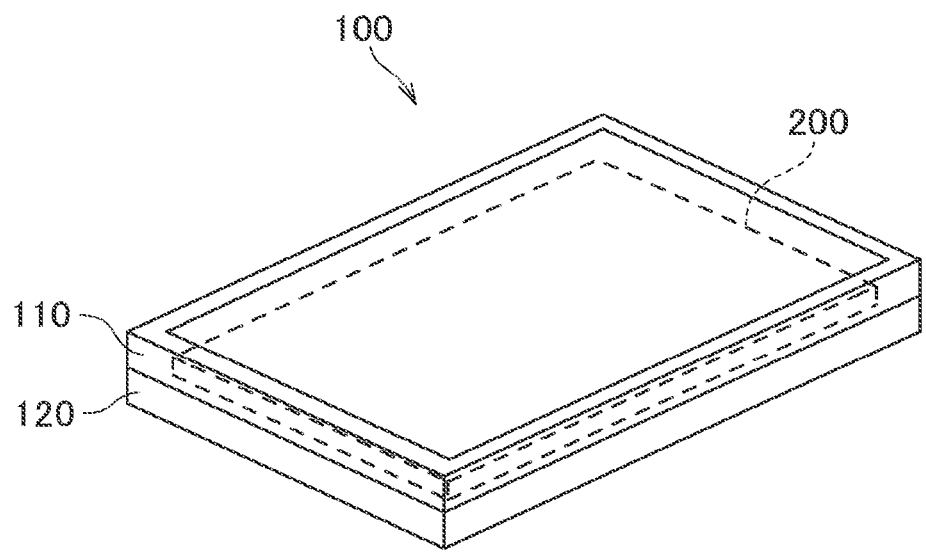
FIG. 1 is a view schematically showing a display device according to an embodiment of the invention.

Hereinafter, embodiments of the invention will be described with reference to the drawings. Although the drawings may sometimes be schematically represented in terms of the width, thickness, shape, or the like of each part as compared with the actual aspect for more explicit illustration, they are illustrative only and not intended to limit the interpretation of the invention. Further, in the specification and the drawings, elements similar to those already described with reference to a previous drawing are denoted by the same reference numerals, and a detailed description thereof is sometimes omitted as appropriate.

FIG. 1 is a view schematically showing a display device 100 according to an embodiment of the invention. As shown in FIG. 1, the display device 100 is configured to include an organic EL panel 200 fixed so as to be sandwiched between an upper frame 110 and a lower frame 120.

Figure 2:
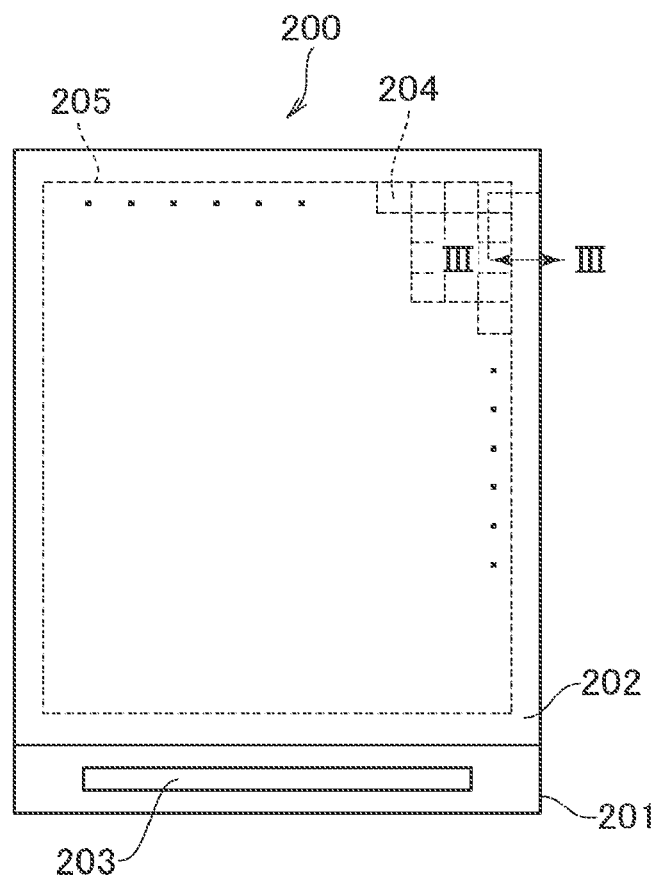
FIG. 2 is a view showing a structure seen from the side where an organic EL panel is displayed.

FIG. 2 is a schematic view showing a structure of the organic EL panel 200 shown in FIG. 1. As shown in FIG. 2, the organic EL panel 200 includes an array substrate 201, a counter substrate 202, and a drive IC (integrated circuit) 203. On the array substrate 201, the below-mentioned hygroscopic agent 308, sealing film 309, and the like are disposed, and the array substrate 201 is bonded to the counter substrate 202 with an adhesive layer (a fill agent 315 and a dam agent 316).

For example, the drive IC 203 applies a potential for making electrical conduction between source and drain to a scanning signal line of a pixel transistor 318 (see FIG. 3 or the like) disposed corresponding to each of a plurality of subpixels 204 constituting one pixel, and also allows a current corresponding to a gradation value of the pixel to flow to a data signal line of each pixel transistor 318. Further, each of the plurality of pixels includes a light-emitting element including an anode electrode 304, a light-emitting layer, and a cathode electrode 307 (described below). By the drive IC 203, the organic EL panel 200 displays a color image constituted by the plurality of subpixels 204 composed of a plurality of colors on a display region 205.

Figure 3:
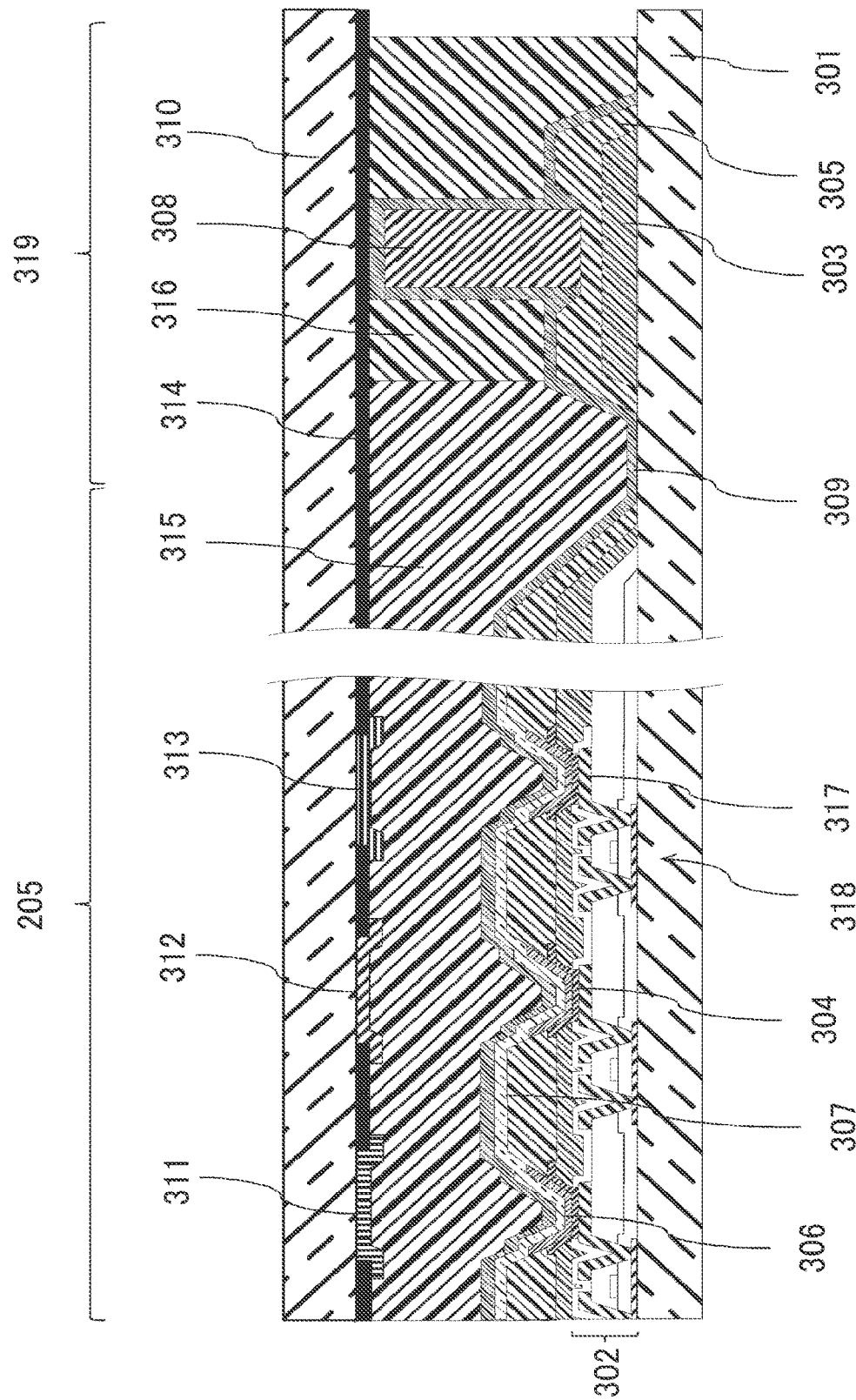
FIG. 3 is a view for illustrating a cross section of the organic EL panel.

FIG. 3 shows one example of a view schematically showing a cross section of a pixel according to the first embodiment, and is a view showing the cross section taken along the line in FIG. 2. In the following description, a case where each of a plurality of pixels is configured to combine three subpixels 204 which emit red light, green light, and blue light, respectively will be described, however, each of the plurality of pixels may be configured to combine four or more subpixels 204.

As shown in FIG. 3, the array substrate 201 is configured to include a lower glass substrate 301, and on the lower glass substrate 301, a TFT (thin film transistor) circuit layer 302, an organic flattening film 303, an anode electrode 304, an organic bank 305, an organic film 306, a cathode electrode 307, a hygroscopic agent 308, and a sealing film 309, which are formed in this order toward the counter substrate 202. The counter substrate 202 is configured to include an upper glass substrate 310, and color filter layers 311, 312, and 313, and a light shielding layer 314, which are formed on the upper glass substrate 310. Further, between the array substrate 201 and the counter substrate 202, a fill agent 315 and a dam agent 316 are filled, and the array substrate 201 and the counter substrate 202 are bonded to each other with the fill agent 315 and the dam agent 316.

The TFT circuit layer 302 includes a pixel transistor 318 configured to include a source electrode, a drain electrode 317, a gate electrode, a semiconductor layer, and the like. The detailed structure of the pixel transistor 318 is the same as that of the related art, and therefore, the description thereof will be omitted.

The organic flattening film 303 is formed so as to cover the TFT circuit layer 302 in the display region 205, and flattens differences in levels due to a wiring or the pixel transistor 318 disposed on the lower layer side. Further, the organic flattening film 303 is formed in a peripheral region 319 which is a region outside the display region 205 so as to surround the display region 205.

The anode electrode 304 is formed in the upper part of the pixel transistor 318. Specifically, for example, the anode electrode 304 is formed on the upper layer side of the source or drain electrode 317 so as to be electrically connected to the source or drain electrode 317 of the pixel transistor 318 through a contact hole of the organic flattening film 303 in the display region 205.

The organic bank 305 is formed in the display region 205 so as to cover the peripheral portion of each of the anode electrodes 304, and is formed in the peripheral region 319 so as to cover the organic flattening film 303. Specifically, for example, as shown in FIG. 3, the organic bank 305 is formed from a resin material on the upper part of an edge portion of the anode electrode 304 and on the upper part of a region between the respective anode electrodes 304 in the display region 205, and also on the upper part of the organic flattening film 303 in the peripheral region 319. By the organic bank 305, a short circuit between the anode electrode 304 and the cathode electrode 307 can be prevented.

The organic film 306 is formed on the upper layer side of the anode electrode 304 and on the upper layer side of an edge portion of the organic bank 305 in the display region 205. Further, the organic film 306 is formed by stacking a hole injection layer, a hole transport layer, a light-emitting layer, an electron injection layer, and an electron transport layer. The light-emitting layer emits light by recombining a hole injected from the anode electrode 304 with an electron injected from the cathode electrode 307. The hole injection layer, the hole transport layer, the electron injection layer, and the electron transport layer are the same as those of the related art, and therefore, the description thereof will be omitted.

The cathode electrode 307 is formed on the upper layer side of the organic film 306. Specifically, for example, the cathode electrode 307 is formed so as to cover the organic bank 305 and the organic film 306 in the display region 205, and by applying a voltage between the cathode electrode 307 and the anode electrode 304, a current is made to flow through the organic film 306, whereby light is emitted. Further, the cathode electrode 307 is formed using a transparent material. Specifically, for example, the cathode electrode 307 is formed from a metal thin film configured to include a metal such as indium tin oxide (ITO) and having a transmission property.

The hygroscopic agent 308 is formed in the peripheral region 319 outside the display region 205. Specifically, for example, as shown in FIG. 3, the hygroscopic agent 308 is formed on the upper layer side of the organic bank 305 in the peripheral region 319 as a support pillar which keeps an interval between the array substrate 201 and the counter substrate 202. Further, the hygroscopic agent 308 is formed from an alkali metal or an alkaline earth metal. Specifically, for example, the hygroscopic agent 308 is formed using a material such as calcium, magnesium, lithium, cesium, or barium.

The hygroscopic agent 308 not only absorbs a water molecule by causing a chemical reaction with a water molecule penetrating from the outside of the organic EL panel 200, but also functions as a barrier which blocks the penetration of a water molecule into the display region 205 after completion of the chemical reaction. Specifically, for example, in the case where the hygroscopic agent 308 is formed using calcium, calcium is converted into calcium hydroxide when it causes a chemical reaction with a water molecule, and the calcium hydroxide blocks the penetration of a water molecule into the display region 205.

Incidentally, in FIG. 3, the hygroscopic agent 308 is formed as a support pillar which keeps an interval between the array substrate 201 and the counter substrate 202, however, the height of the hygroscopic agent 308 may be smaller than the interval between the array substrate 201 and the counter substrate 202. Specifically, for example, the hygroscopic agent 308 may be configured to have an upper face facing the counter substrate 202, and a portion of the sealing film 309 is located between the upper face and the counter substrate 202. Even if such a configuration is adopted, by functioning as the hygroscopic agent 308 until the chemical reaction of calcium is completed, the penetration of a water molecule into the display region 205 is blocked. Further, the hygroscopic agent 308 having a pillar shape may be formed such that a distance from the array substrate 201 to the upper face of the hygroscopic agent 308 is larger than a distance from the array substrate 201 to the surface of the sealing film 309 in the display region 205.

Figure 4A:
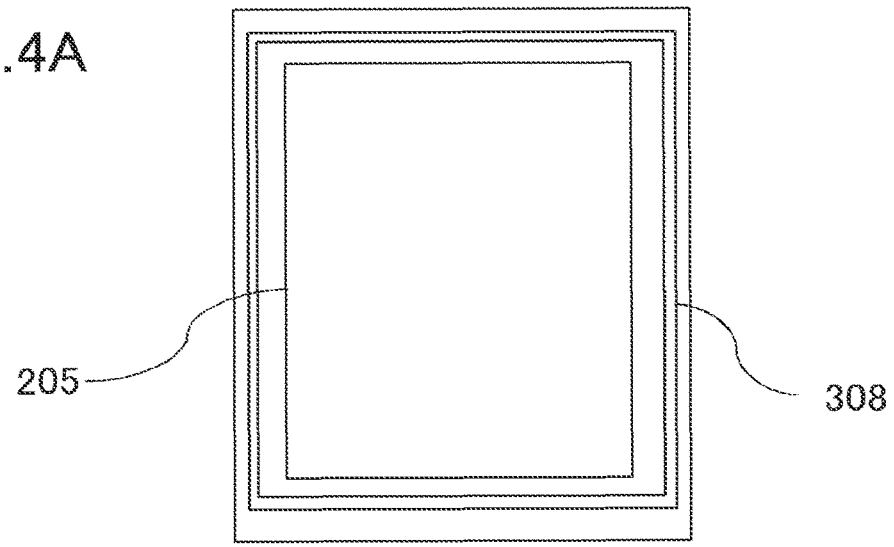
FIGS. 4A to 4C are views for illustrating the layout of a hygroscopic agent.
Figure 4B:
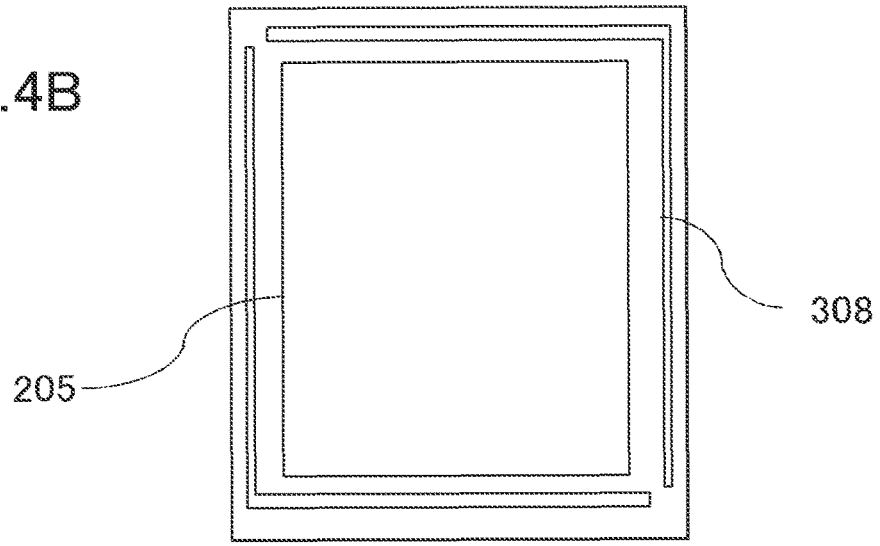
Figure 4C:
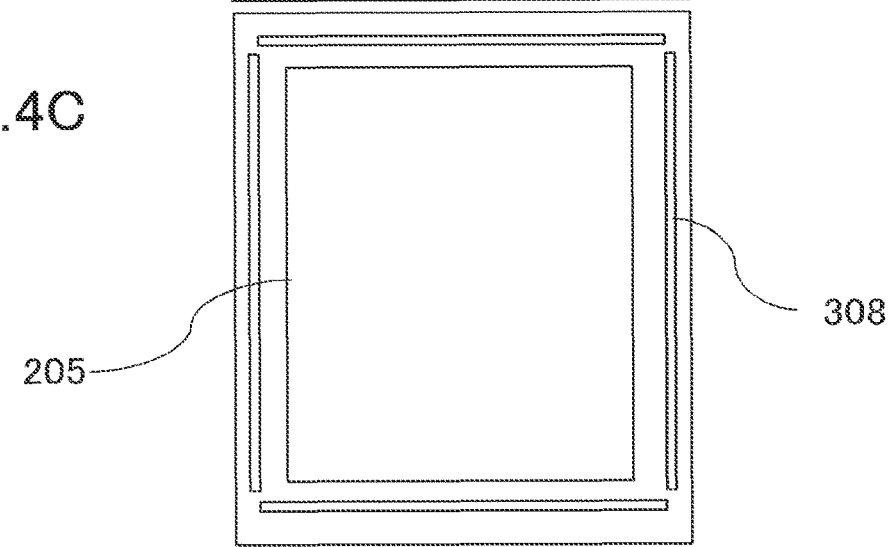

Next, a planar layout of the hygroscopic agent 308 will be described. The hygroscopic agent 308 is formed so as to surround the four sides of the peripheral region 319 with at least two discontinuous regions. Specifically, for example, with reference to FIGS. 4A to 4C, the layout of the hygroscopic agent 308 will be described. As shown in FIG. 4A, the hygroscopic agent 308 is formed in the peripheral region 319 so as to surround the entire periphery of the display region 205. By forming the hygroscopic agent 308 so as to surround the display region 205, after completion of the chemical reaction of the hygroscopic agent 308, the penetration of a water molecule into the display region 205 from the outside of the organic EL panel 200 is blocked. Incidentally, as shown in FIGS. 4B and 4C, the hygroscopic agent 308 may be formed in two or four pieces. According to such a configuration, the hygroscopic agent 308 can be formed in a simpler manufacturing step than the manufacturing step of the hygroscopic agent 308 shown in FIG. 4A.

The sealing film 309 is formed so as to cover the hygroscopic agent 308. Specifically, as shown in FIG. 3, the sealing film 309 is formed so as to cover the cathode electrode 307 in the display region 205, in other words, so as to cover the light-emitting element including the anode electrode 304, the organic film 306 having a light-emitting layer, the cathode electrode 307, and the like, and in the peripheral region 319, so as to cover the organic bank 305 and the hygroscopic agent 308. By covering the hygroscopic agent 308 with the sealing film 309, in the process for manufacturing the organic EL panel 200, a chemical reaction between the hygroscopic agent 308 and a water molecule can be prevented from proceeding.

Further, in FIG. 3, a case where the sealing film 309 does not have a pore is shown, however, the sealing film 309 may have a pore which exposes the hygroscopic agent 308, a pore which is recessed toward the upper face of the hygroscopic agent 308, or a pore (penetration pore) which allows the penetration of a water molecule. Specifically, for example, the sealing film 309 may be configured to have a crack generated by pressing when bonding the array substrate 201 to the counter substrate 202. The pore may expose the upper face of the hygroscopic agent 308 or may expose the side face of the hygroscopic agent 308. Further, in the case where a configuration in which a portion of the sealing film 309 is located between the upper face of the hygroscopic agent 308 and the counter substrate 202 is adopted, a configuration in which a pore recessed toward the upper face is provided in a portion of the sealing film 309 may be adopted. Although a detailed description will be made later, by generating a penetration pore in the sealing film 309 in a step of bonding the array substrate 201 to the counter substrate 202, the hygroscopic agent 308 can be brought to a state where it exhibits hygroscopicity only after the bonding step is completed.

The color filter layers 311, 312, and 313 are formed from a material which transmits only light having a specific wavelength. For example, the color filter layers are configured to include a red color filter layer 311 which selectively transmits red light, a green color filter layer 312 which selectively transmits green light, and a blue color filter layer 313 which selectively transmits blue light. Specifically, as shown in FIG. 3, in the order from the left in the drawing, the red color filter layer 311, the green color filter layer 312, and the blue color filter layer 313 are formed on the upper glass substrate 310.

The light shielding layer 314 is formed from a material which blocks light. Specifically, for example, as shown in FIG. 3, the light shielding layer 314 is formed between the color filter layers in the display region 205 and the peripheral region 319. By the light shielding layer 314, color mixing due to mixing of lights emitted from adjacent subpixels 204 is prevented.

The adhesive layer is formed by including the fill agent 315 and the dam agent 316. At least a portion of the adhesive layer is disposed inside the hygroscopic agent 308, that is, closer to the side of the display region 205 than the hygroscopic agent 308, and bonds the array substrate 201 to the counter substrate 202. At least a portion of the fill agent 315 is located in the display region 205, and the sealing film 309 is formed so as to be covered with the fill agent 315 in the display region 205. Specifically, for example, the fill agent 315 is disposed inside the hygroscopic agent 308, that is, closer to the side of the display region 205 than the hygroscopic agent 308. The fill agent 315 is composed of an organic material and is disposed inside the hygroscopic agent 308, thereby bonding the array substrate 201 to the counter substrate 202.

The dam agent 316 is formed such that it is located in the peripheral region 319 and surrounds the display region 205 and also covers the hygroscopic agent 308. Specifically, the dam agent 316 is formed outside the fill agent 315 so as to surround the display region 215 using a material having a lower water permeability than the fill agent 315.

As described above, according to the configuration of the invention, the hygroscopic agent 308 absorbs a water molecule until the chemical reaction of the hygroscopic agent 308 is completed, and also suppresses the penetration of a water molecule into the light-emitting element after the chemical reaction is completed, and therefore, the deterioration of the light-emitting element is prevented.

Incidentally, in the above description, a configuration in which the array substrate 201 and the counter substrate 202 are bonded to each other is described, however, a configuration in which the counter substrate 202 is not included may be adopted. In such a modification, an organic EL panel 200 includes a display region 205 including a plurality of pixels, and a peripheral region 319 outside the display region 205 in the same manner as described above. Then, the organic EL panel 200 is configured to include an array substrate 201 and a drive IC (integrated circuit) 203.

Then, the array substrate 201 is formed by including a sealing film 309 which is located astride the display region 205 and the peripheral region 319, and covers a light-emitting element, a hygroscopic agent 308 which is located between a lower glass substrate 301 and a sealing film 309, and the like in the same manner as described above. This modification is different from the above embodiment in that the light-emitting layer contained in the array substrate is formed from a material which emits light with a different color for each subpixel 204.

Further, in this modification, the counter substrate 202 is not provided, however, in the array substrate 201, a dam agent 316 is provided. Specifically, the array substrate 201 is formed such that the dam agent 316 which surrounds the display region 205 is provided in the peripheral region 319, and a portion of the sealing film 309 and the hygroscopic agent 308 are covered with the dam agent 316.

Also in this modification, the sealing film 309 may be formed so as to have a pore which exposes the hygroscopic agent 308. Further, a configuration in which the hygroscopic agent 308 has an upper face located on the opposite side to the lower glass substrate 301, and a portion of the sealing film 309 faces the upper face and is provided with a pore which is recessed toward the upper face may be adopted. Further, the hygroscopic agent 308 may be formed from an alkali metal or an alkaline earth metal (for example, calcium). In addition, a configuration in which the hygroscopic agent 308 is formed into a pillar shape, and a distance from the lower glass substrate 301 to the upper face of the hygroscopic agent 308 formed into a pillar shape is larger than a distance from the lower glass substrate 301 to the surface located on the opposite side to the lower glass substrate 301 of the sealing film 309 in the display region 205 may be adopted.

Figure 5A:
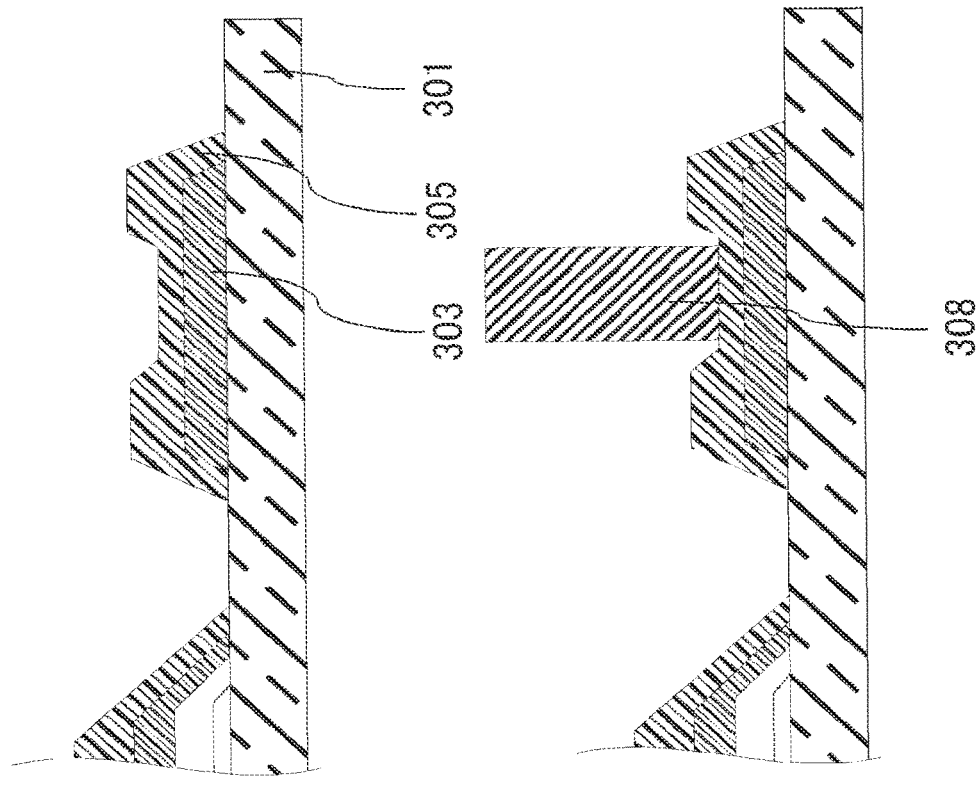
FIGS. 5A and 5B are views for illustrating a step of manufacturing the organic EL panel.

Next, a step of manufacturing the display device 100 according to the invention will be described. FIGS. 5A to 7 are views illustrating the manufacturing step according to an embodiment of the invention. First, as shown in FIG. 5A, on a lower glass substrate 301, a TFT circuit layer 302 is formed, and then, an organic flattening film 303 is formed so as to cover the TFT circuit layer 302. Here, the organic flattening film 303 is also formed in a peripheral region 319. Subsequently, a contact hole is formed in the organic flattening film 303 stacked on the upper part of a drain electrode 317, and an anode electrode 304 is formed on the drain electrode 317 in the opening. Then, an organic bank 305 is formed so as to cover the peripheral portion of each of the anode electrodes 304. Here, the organic bank 305 is also formed on the upper layer side of the organic flattening film 303 formed in the peripheral region 319. Further, in the display region 205, an organic film 306 is formed on the upper layer side of the anode electrode 304 and on the upper layer side of an edge portion of the organic bank 305, and a cathode electrode 307 is formed on the upper layer side of the organic film 306.

Figure 5B:
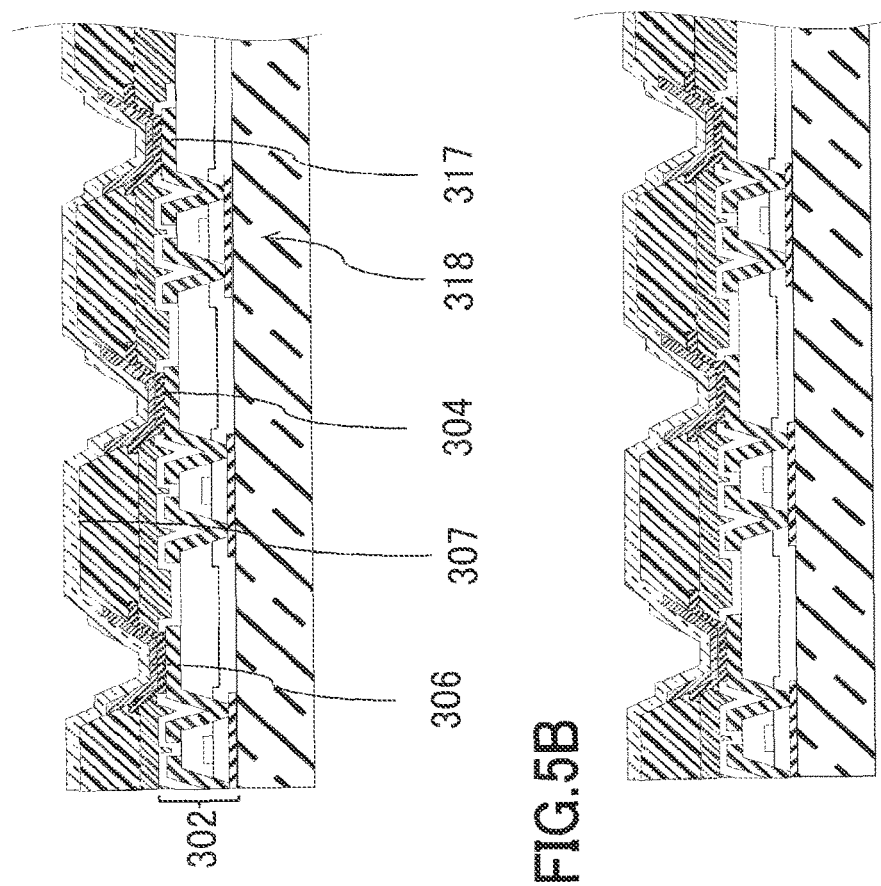

Subsequently, as shown in FIG. 5B, a hygroscopic agent 308 is formed on the upper layer side of the organic bank 305 formed in the peripheral region 319. Here, the hygroscopic agent 308 is formed such that the height of the hygroscopic agent 308 is equal to an interval between the array substrate 201 and the counter substrate 202 or larger than an interval between the array substrate 201 and the counter substrate 202. Further, the hygroscopic agent 308 is formed by a method such as a vacuum vapor deposition method.

Subsequently, as shown in FIG. 6A, a sealing film 309 is formed so as to cover the cathode electrode 307 formed in the display region 205, and the organic bank 305 and the hygroscopic agent 308 formed in the peripheral region 319. Here, the sealing film 309 is desirably formed continuously in an environment in which the hygroscopic agent 308 does not come in contact with air after the step of forming the hygroscopic agent 308. By forming the sealing film 309 immediately after the step of forming the hygroscopic agent 308, a chemical reaction between the hygroscopic agent 308 and a water molecule or the like can be prevented from proceeding.

Subsequently, as shown in FIG. 6B, an adhesive is dropped onto the array substrate 201. Specifically, for example, by using a dispenser, a dam agent 316 is dropped so as to overlap with the hygroscopic agent 308 and the organic bank 305 formed in the peripheral region 319, and a fill agent 315 is dropped at given intervals in the display region 205.

Figure 7:
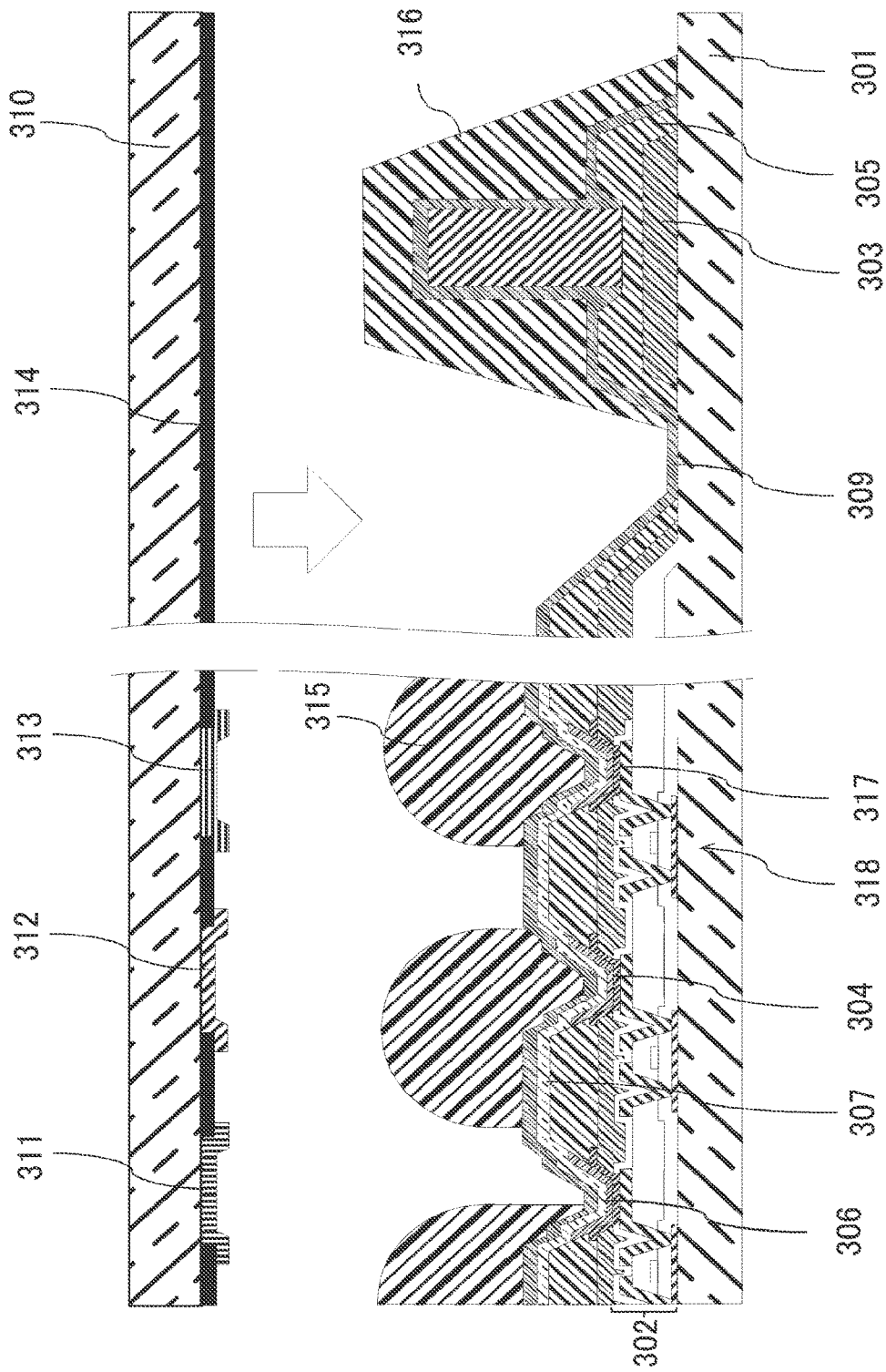
FIG. 7 is a view for illustrating a step of manufacturing the organic EL panel.

Then, as shown in FIG. 7, the array substrate 201 onto which the dam agent 316 and the fill agent 315 are dropped in the step of FIG. 6B and the counter substrate 202 are bonded to each other. Here, the method of manufacturing the counter substrate 202 is the same as that of the related art, and therefore, a description thereof will be omitted. As described above, the hygroscopic agent 308 is formed such that the height of the hygroscopic agent 308 is equal to or larger than the interval between the array substrate 201 and the counter substrate 202, and therefore, when bonding the array substrate 201 to the counter substrate 202, a pressure is applied to the sealing film 309 formed so as to cover the hygroscopic agent 308. As a result, a crack through which a water molecule or the like permeates is generated in the sealing film 309 formed so as to cover the hygroscopic agent.

As described above, the sealing film 309 formed in the step of FIG. 6A prevents the progress of a chemical reaction between the hygroscopic agent 308 and a water molecule in the step until a crack is generated by pressing in the step shown in FIG. 7. Then, by making the hygroscopic agent 308 not exhibit its function until a penetration pore is generated in the step shown in FIG. 7, the period in which the hygroscopic agent 308 exhibits hygroscopicity can be kept long. In addition, the hygroscopic agent is formed such that the height of the hygroscopic agent is equal to or larger than the interval between the array substrate 201 and the counter substrate 202, and the hygroscopic agent is converted into a material through which a water molecule or the like does not permeate after the chemical reaction with a water molecule is completed, and therefore, the penetration of a water molecule or the like into the display region from the outside can be prevented also after completion of the chemical reaction.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, which includes a display region constituted by a plurality of pixels, comprising:
   a first substrate having a hygroscopic agent formed in a peripheral region outside the display region and a sealing film covering the hygroscopic agent;
   a second substrate disposed facing the first substrate;
   an adhesive layer, at least a portion of which is disposed closer to a side of the display region than the hygroscopic agent, and which bonds the first substrate to the second substrate; and
   wherein the hygroscopic agent is formed as a support pillar which keeps an interval between the first substrate and the second substrate.

2. The display device according to claim 1, wherein the hygroscopic agent has an upper face facing the second substrate,
   a portion of the sealing film is located between the upper face and the second substrate, and
   the portion is provided with a pore which is recessed toward the upper face.

3. The display device according to claim 2, wherein the pore exposes the upper face.

4. The display device according to claim 1, wherein the hygroscopic agent is formed from an alkali metal or an alkaline earth metal.

5. The display device according to claim 1, wherein the hygroscopic agent is formed so as to surround four sides of the peripheral region with at least two discontinuous regions.

6. The display device according to claim 1, wherein
   each of the plurality of pixels includes a light-emitting element including an anode electrode, a light-emitting layer, and a cathode electrode, and
   the sealing film covers the light-emitting element.

7. The display device according to claim 1, wherein
   at least a portion of the adhesive layer is located in the display region, and
   the sealing film is covered with the adhesive layer in the display region.

8. The display device according to claim 1, wherein the adhesive layer is located in the peripheral region so as to surround the display region and also cover the hygroscopic agent.

9. A display device, which includes a display region constituted by a plurality of pixels, comprising:
   a first substrate having a hygroscopic agent formed in a peripheral region outside the display region and a sealing film covering the hygroscopic agent;
   a second substrate disposed facing the first substrate;
   an adhesive layer, at least a portion of which is disposed closer to a side of the display region than the hygroscopic agent, and which bonds the first substrate to the second substrate; and
   wherein the sealing film has a pore which exposes the hygroscopic agent.

10. The display device according to claim 9, wherein the pore is a penetration pore which allows penetration of a water molecule.

11. A display device, comprising a display region including a plurality of pixels, and a peripheral region outside the display region, wherein
   each of the plurality of pixels includes a light-emitting element including an anode electrode, a light-emitting layer, and a cathode electrode,
   the light-emitting element is provided on a first substrate,
   in the first substrate, a sealing film which is located astride the display region and the peripheral region, and covers the light-emitting element is provided,
   in the peripheral region, a hygroscopic agent which is located between the first substrate and the sealing film is provided,
   in the peripheral region, a dam agent which surrounds the display region is provided,
   a portion of the sealing film and the hygroscopic agent are covered with the dam agent.

12. The display device according to claim 11, wherein the sealing film has a pore which exposes the hygroscopic agent.

13. The display device according to claim 11, wherein
   the hygroscopic agent has an upper face located on an opposite side to the first substrate of the hygroscopic agent,
   a portion of the sealing film faces the upper face, and the portion is provided with a pore which is recessed toward the upper face.

14. The display device according to claim 11, wherein the hygroscopic agent contains an alkali metal or an alkaline earth metal.

15. The display device according to claim 11, wherein
the hygroscopic agent is formed into a pillar shape,
the sealing film has a surface located on an opposite side to the first substrate of the sealing film, and
a distance from the first substrate to the upper face of the hygroscopic agent formed into the pillar shape is larger than a distance from the first substrate to the surface in the display region.

* * * * *